United States Patent [19]

Ohara et al.

[11] Patent Number: 5,304,277
[45] Date of Patent: Apr. 19, 1994

[54] PLASMA PROCESSING APPARATUS USING PLASMA PRODUCED BY MICROWAVES

[75] Inventors: Kazuhiro Ohara, Yokohama; Toru Otsubo, Fujisawa; Ichirou Sasaki, Yokohama, all of Japan

[73] Assignee: Hitachi, Ltd., Tokyo, Japan

[21] Appl. No.: 767,798

[22] Filed: Sep. 30, 1991

[30] Foreign Application Priority Data

Sep. 28, 1990 [JP] Japan .................... 2-256893

[51] Int. Cl.⁵ .......................... H01L 21/00
[52] U.S. Cl. ................... 156/345; 156/643; 118/723; 204/298.04; 204/298.36; 204/298.16
[58] Field of Search ............ 156/345, 643; 118/723; 204/298.36, 298.37, 298.38, 298.04, 298.16

[56] References Cited

U.S. PATENT DOCUMENTS

| | | | |
|---|---|---|---|
| 4,776,918 | 10/1988 | Otsubo et al. | 156/345 |
| 4,960,073 | 10/1990 | Suzuki et al. | 156/345 |
| 4,985,109 | 1/1991 | Otsubo et al. | 156/345 |
| 5,021,114 | 6/1991 | Saito et al. | 156/643 |
| 5,032,202 | 7/1991 | Tsai et al. | 156/643 |

FOREIGN PATENT DOCUMENTS

| | | |
|---|---|---|
| 56-013480 | 2/1981 | Japan . |
| 63-038585 | 8/1986 | Japan . |
| 62-013575 | 1/1987 | Japan . |
| 63-172429 | 7/1988 | Japan . |
| 63-244617 | 10/1988 | Japan . |
| 1-187824 | 7/1989 | Japan . |
| 2-017636 | 1/1990 | Japan . |
| 2-081434 | 3/1990 | Japan . |
| 2-138735 | 5/1990 | Japan . |

Primary Examiner—Brian E. Hearn
Assistant Examiner—George Goudreau
Attorney, Agent, or Firm—Antonelli, Terry, Stout & Kraus

[57] ABSTRACT

A plasma processing apparatus includes a plasma processing chamber having a stage for placing a substrate to be plasma processed, an exhaust port and a gas introduction nozzle for plasma processing coupled therewith, and a cavity resonator for closing the plasma processing chamber in vacuum manner and coupled through a microwave introducing window through which microwaves are introduced and having slots for radiating microwaves to the plasma processing chamber. Microwaves having increased intensity of an electromagnetic field is supplied to the processing chamber to produce plasma to effect processing of the substrate. An area in which diffusion of plasma is suppressed to reduce loss is formed only in the vicinity of an inner wall of the processing chamber.

9 Claims, 10 Drawing Sheets

DIRECTION OF
ELECTRIC FIELD

F I G. 13
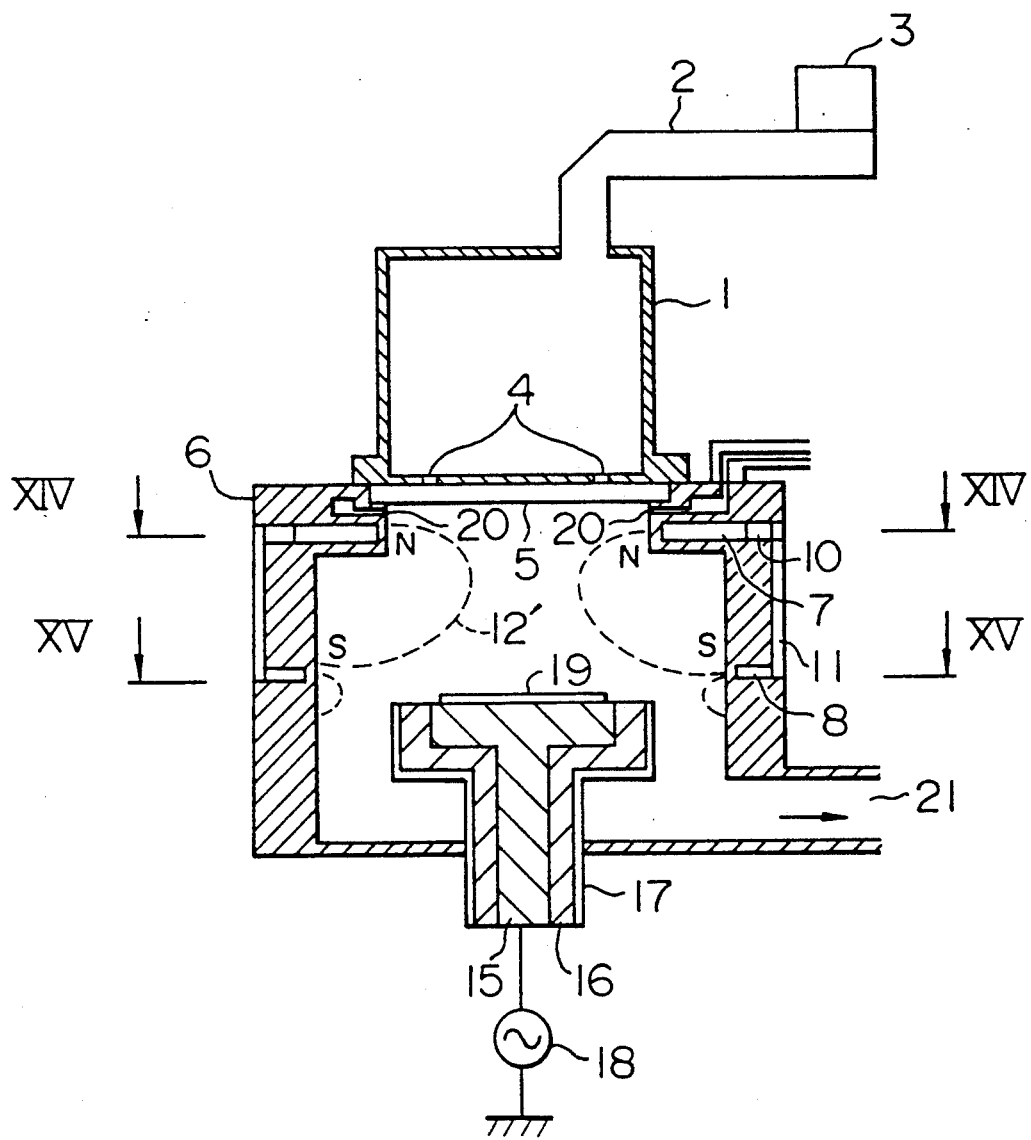

PLASMA PROCESSING APPARATUS USING PLASMA PRODUCED BY MICROWAVES

BACKGROUND OF THE INVENTION

The present invention relates to a plasma processing apparatus which performs dry etching processing or plasma CVD processing of a semiconductor substrate, and more particularly to a microwave plasma processing apparatus which produces high-density and uniform plasma stably with low pressure and is suitable for uniform processing of a substrate having a large diameter.

A plasma processing apparatus for a semiconductor device introduces processing gas into a plasma processing chamber (hereinafter referred to as a processing chamber) having a vacuum atmosphere therein to produce plasma in the dry etching process and produces ions and radical having chemically high reactivity by ionization and dissociation of the processing gas. The active particles act physically and chemically to etch and remove a desired portion of a processed film on a semiconductor substrate so that a device pattern is formed. In such an apparatus, in order to attain the etching process faithful to a mask pattern and having a so-called reduced side etching, it is necessary to effect processing by low-pressure plasma to increase the directivity of ions and reduce the effect of radical for advancing the etching isotropically. However, since the density of ions and radical is reduced in the low-pressure plasma, it is necessary to produce high-density plasma even in the low pressure in order to ensure the processing speed.

As a method of producing the low-pressure and high-density plasma, there are known methods described in, for example, U.S. Pat. Nos. 4,776,918 and 4,985,109 (corresponding to European Patent Applications 87115349.0 filed October 1987 and 90101864.8 filed January 1990, respectively). In the methods, the intensity of an electromagnetic field of microwaves is increased by a cavity resonator just before the microwaves are introduced into the processing chamber and the microwaves having the increased intensity of the electromagnetic field is introduced into the processing chamber through slots provided in an end surface of the cavity resonator on the side of the processing chamber so that energy is applied to electrons with the increased intensity of the electric field to produce plasma.

Further, JP-A-2-017636 discloses a method in which a coil for generating a magnetic field is disposed around a plasma production chamber in order to produce the low-pressure and high-density plasma so that an ECR (Electron Cyclotron Resonance) occurs in the plasma production chamber.

SUMMARY OF THE INVENTION

A semiconductor substrate to be plasma processed is being developed to have a larger diameter from 150 mm to 200 mm for improvement of the productivity. For the plasma processing of such a semiconductor substrate having a large diameter, it is necessary to produce plasma having a large diameter uniformly. However, in the prior art described above, consideration is not sufficiently paid to uniform production of plasma having a large diameter and it is difficult to effect the plasma processing of the semiconductor substrate having a diameter of 200 mm or more with uniformity of ±5% or less. More particularly, in the prior art, since there is a loss of electrons and ions in plasma to an inner wall of the processing chamber, a slope in the plasma density occurs in a radial direction of the processing chamber. Accordingly, it is difficult to obtain uniform distribution of the plasma density in the vicinity of the semiconductor substrate over a wide area having a diameter of 200 mm or more only by adjustment of the arrangement of the slots.

Accordingly, in view of the above problems, it is an object of the present invention to provide a microwave plasma processing apparatus capable of producing plasma having a large diameter uniformly and processing a semiconductor substrate having a large diameter uniformly.

According to an aspect of the present invention, in order to achieve the above object, in the microwave plasma processing apparatus in which microwaves are introduced into a cavity resonator to be resonated therein just before the microwaves are introduced into a processing chamber and microwaves having the increased intensity of an electromagnetic field are further introduced into the processing chamber through slots provided in an end surface of the cavity resonator on the side of the processing chamber to produce plasma, diffusion of the plasma is substantially suppressed only in the vicinity of an inner wall of the processing chamber to provide an area (hereinafter referred to as a loss suppression area or a reduction area) for reducing a loss.

The loss suppression area of the plasma can be formed by a multi-pole cusp magnetic field formed by arranging a plurality of permanent magnets or coil magnets in the outside or inside of the processing chamber so that adjacent polarities of the magnets are opposite to each other.

In the microwave plasma processing apparatus in which microwaves are introduced into the processing chamber through the slots provided in the end surface on the side of the processing chamber of the cavity resonator coupled with the processing chamber through a microwave introducing window, the intensity of the electromagnetic field of the microwaves introduced in the processing chamber is strong and the high-density plasma can be produced even in the low pressure. The plasma produced in the vicinity of the lower portion of the slots in the processing chamber is spread in the whole processing chamber and electrons and ions in the plasma reach the wall surface of the processing chamber, so that they are re-combined and extinguished. Thus, the density of the plasma in the processing chamber is determined by the balance of a production amount of the plasma under the slots and a loss in the inner wall of the processing chamber.

When a magnetic field is present in the plasma, charged particles such as electrons and ions in the plasma receive the Lorentz force in the direction perpendicular to the movement direction of the charged particles and the magnetic field and accordingly perform the cyclotron movement about the magnetic lines of force. Thus, by forming the magnetic field parallel to the inner wall of the processing chamber, the charged particles moving toward the inner wall of the processing chamber from the plasma perform the cyclotron movement with a radius inversely proportional to a magnitude of the magnetic flux density and accordingly diffusion of the charged particles to the inner wall of the processing chamber can be suppressed to reduce a loss.

By forming the loss suppression area of plasma by the magnetic field only in the vicinity of the inner wall of the processing chamber, since there is no diffusion suppression effect of the charged particles in the plasma in the middle area of the processing chamber, the distribution of the plasma density in an open area and non-open area of the slots in the vicinity of the slots is equalized to the vicinity of the semiconductor substrate by the diffusion. Further, since a loss of the charged particles at the inner wall of the processing chamber is suppressed in the vicinity of the inner wall of the processing chamber, a slope of the distribution of the plasma density in the radial direction of the processing chamber is relieved. Consequently, the plasma having a large diameter of 200 mm or more can be produced uniformly.

The loss suppression area of plasma formed only in the vicinity of the inner wall of the processing chamber is realized by the multi-pole cusp magnetic field obtained by arranging the plurality of permanent magnets or coil magnets so that adjacent magnetic poles of the magnets disposed nearer to the processing chamber are opposite to each other. This can be realized by a reason to be described. More particularly, since the magnets are arranged so that the polarities of adjacent magnetic poles are opposite to each other, the magnetic fields from the magnetic poles are canceled one another in the middle portion of the processing chamber, so that the magnetic field in the middle portion is very small even if it is produced. Further, the magnetic lines of force from one magnetic field do not enter into the processing chamber deeply and flow to the adjacent magnetic pole along the inner wall of the processing chamber. Accordingly, strong magnetic fields parallel to the inner wall of the processing chamber are formed in the vicinity of the processing chamber, so that the area in which diffusion of the charged particles in the plasma to the inner wall of the processing chamber is suppressed by the magnetic fields and a loss is reduced can be formed only in the vicinity of the inner wall of the processing chamber.

BRIEF DESCRIPTION OF THE DRAWINGS

FIG. 13 is a longitudinal sectional view showing a fifth embodiment of a microwave plasma processing apparatus according to the present invention;

DESCRIPTION OF THE PREFERRED EMBODIMENTS

Figure 1:
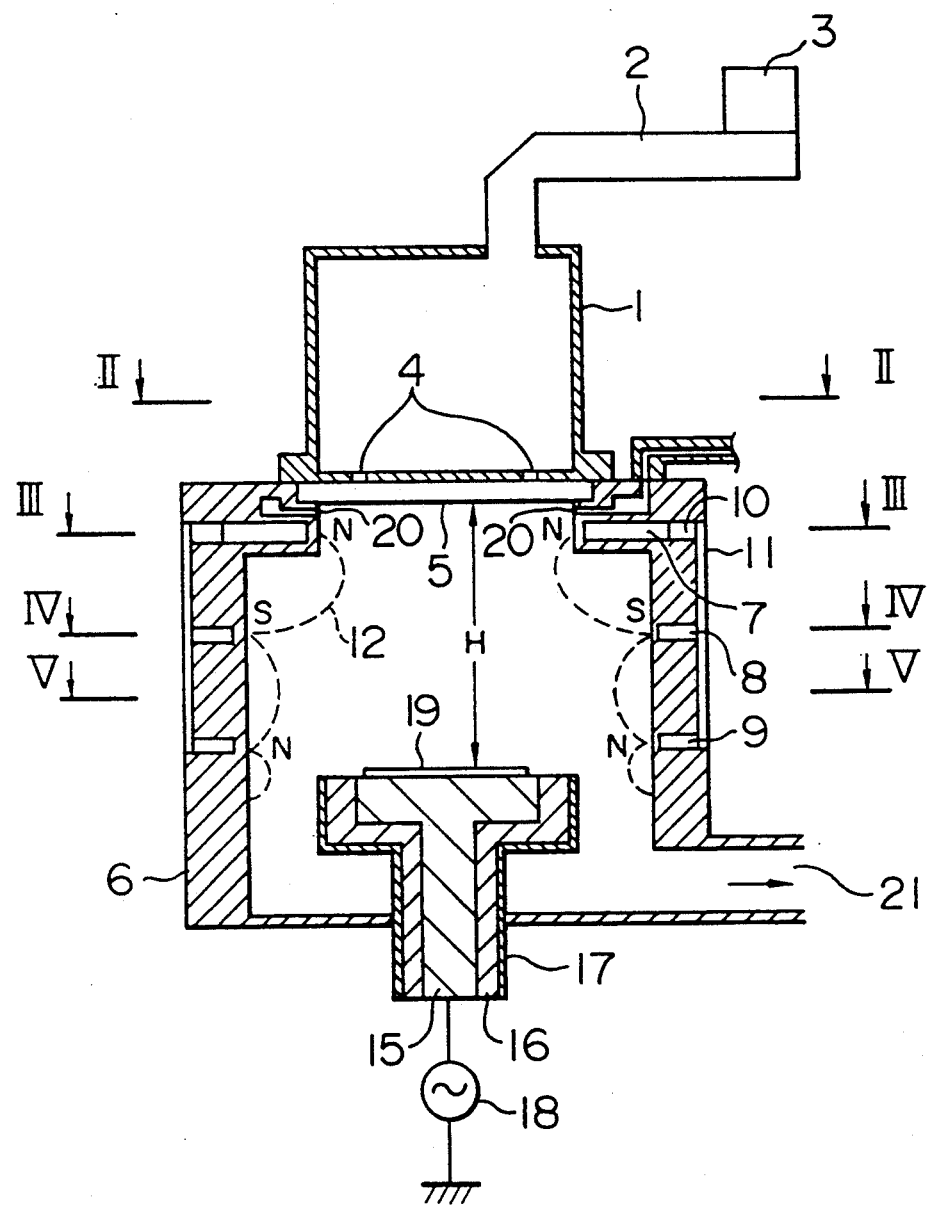
FIG. 1 is a longitudinal sectional view showing a first embodiment of a microwave plasma processing apparatus according to the present invention.

Preferred embodiments of the present invention are now described with reference to the accompanying drawings. Throughout the drawings, like elements are designated by like reference numerals and repetition of description is omitted.

Referring to FIGS. 1 to 8, a first embodiment is now described.

Figure 2A:
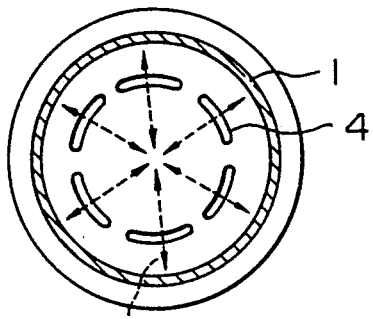
FIGS. 2A and 2B are cross-sectional views taken along line II—II of FIG. 1.
Figure 2B:
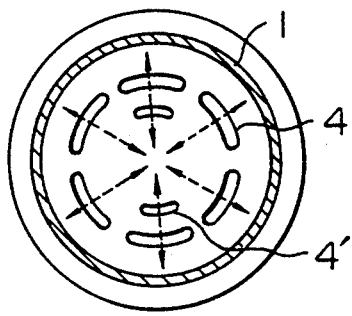

FIG. 1 is a longitudinal sectional view showing the first embodiment of a microwave plasma processing apparatus according to the present invention. FIGS. 2A, 2B, 3 and 4 are sectional views of a cavity resonator taken along line II—II of FIG. 1 and sectional views of a processing chamber taken along lines III—III and IV—IV of FIG. 1, respectively. In FIG. 1, attached to a cavity resonator 1 is a magnetron 3 constituting a generator of microwaves having 2.45 GHz through a waveguide 2. The cavity resonator 1 is designed to be resonated in a specific resonance mode. When the circular cavity resonator is operated in $TM_{01}$ mode, slots 4 are formed into a concentrically arcuated shape in the direction transverse to a magnetic field as shown in FIG. 2. The slots may be formed in multiple as shown by 4 and 4' of FIG. 2B.

The cavity resonator 1 of FIG. 1 is coupled with a processing chamber 6 through a microwave introducing window 5 made of an dielectric such as quartz or alumina at a surface provided with the slots 4 and cavity resonator 1 under atmospheric pressure is separated from the processing chamber 6 under vacuum atmosphere through the microwave introducing window 5.

Permanent magnets 7, 8 and 9 are disposed in the atmosphere on the side of the processing chamber 6 and yokes 10 and 11 made of material having high permeability are disposed on an outer periphery of the permanent magnets. The magnetic poles of the permanent magnets 7, 8 and 9 are disposed so that the polarities thereof at the inner wall of the processing chamber are opposite to those of the adjacent magnetic poles as N, S and N. Accordingly, the magnetic fields are formed as shown by the magnetic lines 12 of force.

Figure 3:
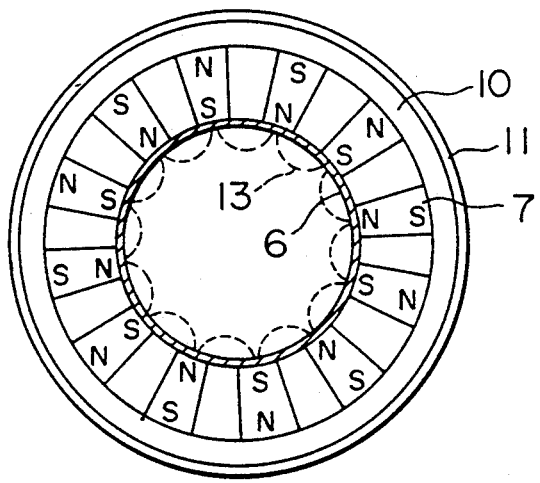
FIG. 3 is a cross-sectional view taken along line III—III of FIG. 1.
Figure 4:
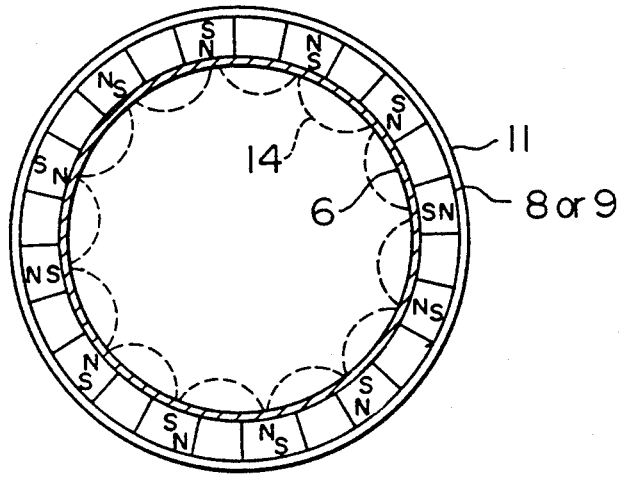
FIG. 4 is a cross-sectional view taken along line IV—IV of FIG. 1.

Further, an even number of permanent magnets 7, 8 and 9 are disposed as shown in the cross-sectional view of the processing chamber in FIGS. 3 and 4 and the polarities of the adjacent magnets are opposite to each other. Accordingly, in the cross-sectional view of the processing chamber 6, the magnetic fields as shown by the magnetic lines 13 and 14 of force are formed. More particularly, the multi-pole cusp magnetic field is formed on the side of the inner wall of the processing chamber 6. The permanent magnets 7, 8 and 9 are constituted by magnets having high residual magnetic flux density so that the magnetic flux density at each of the magnetic poles in the processing chamber satisfies a condition of ECR (Electron Cyclotron Resonance) of 0.0875T.

Figure 5:
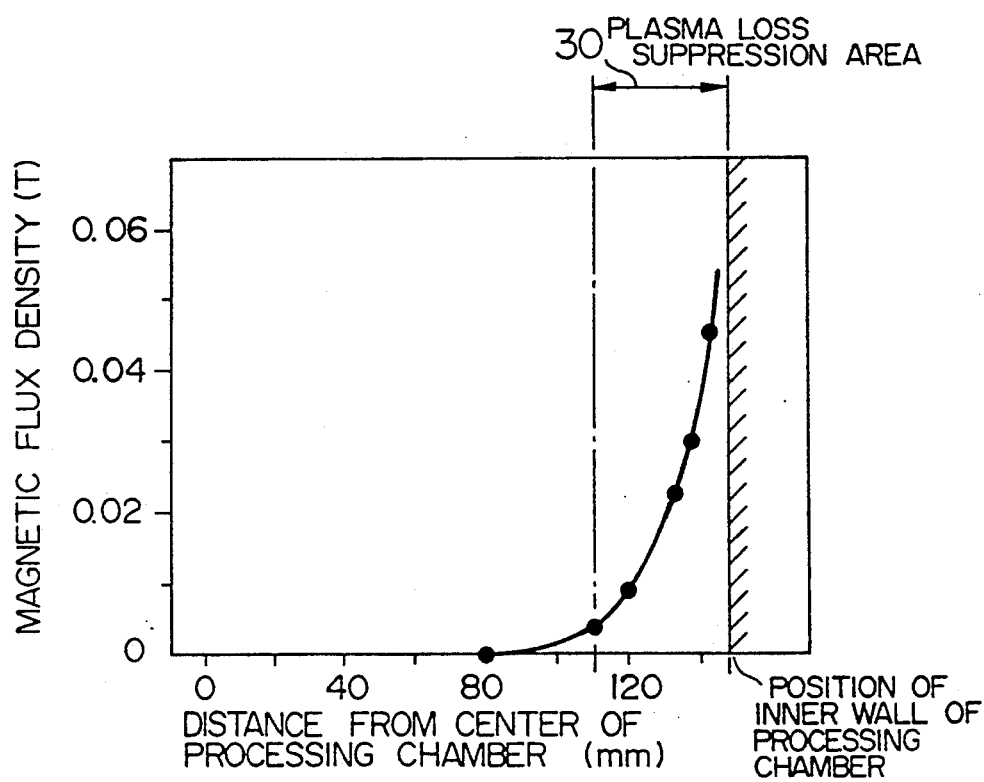
FIG. 5 is a plot of actually measured values of magnetic flux densities at a cross-sectional view taken along line V—V of FIG. 1.

FIG. 5 is a graph of actually measured values of the magnetic flux densities in positions parallel to the inner wall of the processing chamber 6 taken along line V—V of FIG. 1 versus a distance from a center of the processing chamber. As shown in FIG. 5, the magnetic density in an area within 80 mm from the center of the processing chamber is $1\times10^{-3}$ T or less, that is, substantially zero, and the charged particles in plasma within this area is diffused isotropically without suppression of diffusion. On the other hand, magnetic fields sufficient to suppress diffusion of the charged particles in plasma are formed in an area within about 40 mm from the inner wall of the processing chamber. Accordingly, by forming the multi-pole cusp magnetic field by the magnets 7, 8 and 9 shown in FIG. 1, the loss suppression or reduction area 30 (FIG. 5) can be formed only in the vicinity of the inner wall of the processing chamber.

A stage 15 made of aluminum is disposed in the processing chamber 6 of FIG. 1 so that the stage is electrically insulated from a ground potential by an insulator 16 and the insulator 16 is covered by a metallic cover 17 connected to the ground potential. The stage 15 is connected to a high frequency power source 18 and a semiconductor substrate 19 to be plasma processed is placed on the stage 15. Further, the processing chamber 6 is coupled with a gas supply device not shown to supply processing gas from a gas supply nozzle 20. The supplied processing gas is reacted and exhausted through an exhaust outlet 21 by an exhaust device not shown. In this case, a pressure in the processing chamber 6 is controlled to a predetermined pressure by a pressure regulator not shown.

With the above structure, operation in the case where the semiconductor substrate 19 is dry etched is now described.

When Al alloy film is dry etched, the processing gas of, for example, $Cl_2 + BCl_3$ is used and supplied from the gas supply nozzle 20 to the processing chamber 6 with a pressure in the processing chamber 6 being controlled to a predetermined pressure $10^0$ to $10^{-2}$ Pa. Subsequently, the magnetron 3 produces microwaves of 2.45 GHz, which is introduced into the cavity resonator 1 through the waveguide 2. The microwaves introduced into the cavity resonator 1 is resonated in the $TM_{01}$ mode, for example, to enhance the electromagnetic field thereof and is radiated into the processing chamber 6 through the slots 4 to thereby produce plasma in the processing chamber 6.

The charged particles in the plasma, specifically electrons moving at thermal speed higher by two digits as compared with ions are captured to the magnetic lines of force 12, 13 and 14 shown in FIGS. 1, 3 and 4 and performs the cyclotron movement and accordingly loss of the electrons to the inner wall of the processing chamber 6 is suppressed.

Accordingly, even if a distance H from the microwave introducing window 5 to the stage 15 is lengthened in order to obtain the plasma having a large diameter, not only the density of plasma in the vicinity of the semiconductor substrate can be maintained to a high density but also the loss of the charged particles to the inner wall of the processing chamber can be suppressed, so that reduction of the plasma density in the radial direction of the processing chamber is relieved and accordingly distribution of the plasma density in the vicinity of the semiconductor substrate is uniform.

Further, by utilizing the electron cyclotron resonance phenomenon at the position of each of the magnetic poles in the processing chamber, the plasma can be formed stably.

Figure 6:
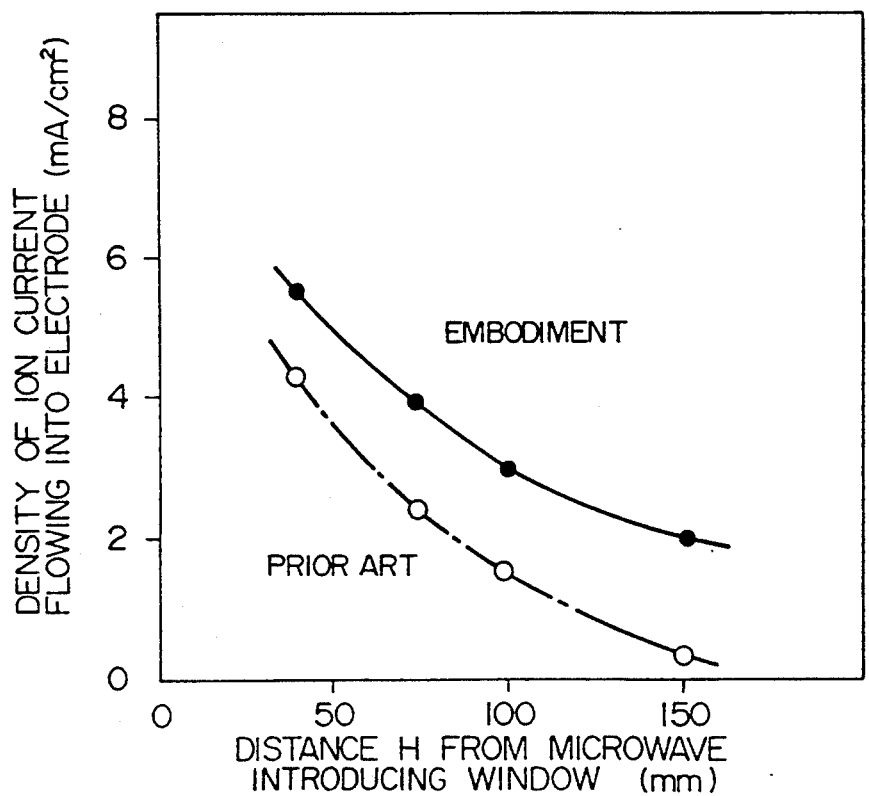
FIGS. 6 and 7 are graphs for explaining effects of the first embodiment.

FIG. 6 is a graph showing a relation of the distance H (refer to FIG. 1) and the density of ion current flowing into the electrode.

A curve shown by black dots connected by solid line indicates actually measured values in the embodiment.

A curve shown by white circles connected by chain line represents actually measured values in the case where the permanent magnets 7, 8 and 9 are removed from the apparatus of the embodiment to make the same state as the conventional apparatus.

According to the embodiment, since the plasma density in the vicinity of the semiconductor substrate can be maintained to a high density, the density of ion current is high and it is effective to maintain the density of plasma to be as high as two to three times that of the conventional apparatus when the distance H is as large as 100 to 150 mm.

Figure 7:
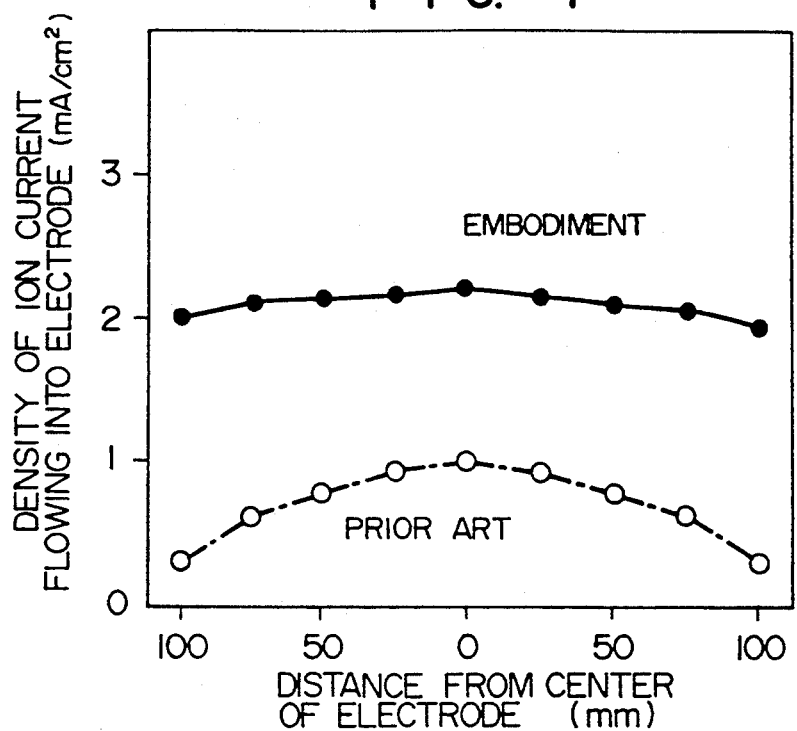

FIG. 7 is a graph showing a relation of a distance from the center of the electrode and the density of ion current flowing into the electrode. Solid line connecting black dots represents actually measured values of the embodiment and chain line connecting white circles represents actually measured values of the conventional apparatus in which the permanent magnets 7, 8 and 9 are removed. Since not only the absolute amount of the ion current density is large in the distribution of the ion current density of the embodiment but also reduction of the ion current density in a peripheral portion of the electrode is suppressed, the high uniformity can be achieved even with the electrode having a large diameter of 200 mm.

According to the embodiment, since the plasma density in the vicinity of the semiconductor substrate having a large diameter of 200 mm or more can be maintained uniformly and stably with high density, the semiconductor substrate having a large diameter can be processed uniformly at high speed. Further, loss of plasma into the inner wall of the processing chamber is suppressed and accordingly sputtering damage of material of the inner wall by incidence of ions in the plasma is reduced. Thus, contamination of the semiconductor substrate by heavy metal in the material of the inner wall is reduced and the semiconductor substrate can be processed with low damage.

Figure 8:
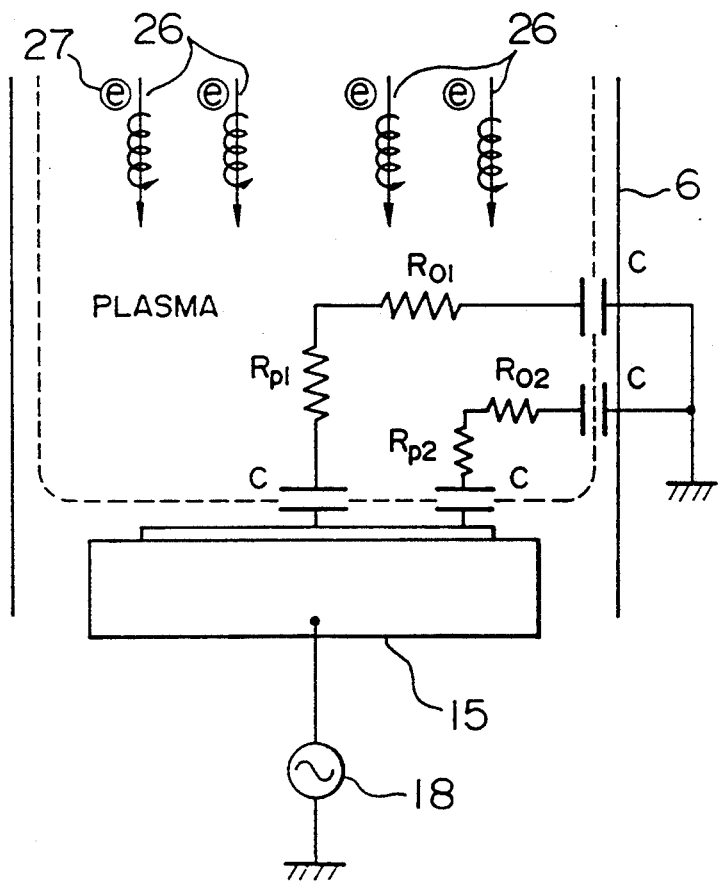
FIG. 8 is a diagram for explaining effects of the first embodiment and showing a model of plasma in the case where magnetic field exists in an entire area of a plasma processing chamber.

FIG. 8 is a diagram for explaining other effects of the embodiment and showing a model of plasma in the case where the magnetic field is present. In the dry etching, a high frequency bias is applied from the high frequency power source 18 to the stage 15 in order to control energy of ions incident to the semiconductor substrate from plasma. A high frequency bias current flows through the plasma to the inner wall of the processing chamber connected to the ground, while in this case the plasma can be equivalently expressed by capacitance C (sheath) and resistances Rp and Ro. When the magnetic field exists in the plasma, movement of electrons 27 are restrained by magnetic lines of force 26. Thus, a difference occurs between the resistance Rp in the direction parallel to the magnetic lines of force and the resistance Ro in the direction perpendicular thereto with respect to the high frequency bias current in the plasma and Ro/Rp in the magnetic field of the order of $1\times10^{-2}$ T is about $10^2$.

Accordingly, when the magnetic field is formed over the whole processing chamber, $R_{01}$ (resistance value at the center) is larger than $R_{02}$ (resistance value at the periphery) as a comparison result therebetween and the high frequency bias current does not flow uniformly over the whole surface of the semiconductor substrate.

According to the present invention, however, since the magnetic field is negligibly small in the central region having a substrate disposed therein of the processing chamber and is formed substantially only in the vicinity of the inner wall of the processing chamber, the high frequency bias current flows uniformly even in the center and periphery of the semiconductor substrate even if the electric resistance is increased by the magnetic field. Further, since formation of the magnetic field is limited to a narrow area in the vicinity of the inner wall of the processing chamber, heating of ions by the interaction between the plasma and the magnetic field is small as compared with the case where the strong magnetic field is formed in the whole area of the processing chamber. Accordingly, ions are accelerated by an inter-sheath voltage formed between the plasma and the substrate and the speed angle distribution of ions upon incidence on the substrate is small. As described above, since ion energy can be controlled uniformly and disturbance of the directivity of ions is also small even if the magnetic field is formed, a fine pattern having large difference in level can be worked with good anisotropy.

In the embodiment, description has been made to the case where the standing wave mode of microwaves in the cavity resonator is the circular $TM_{01}$ mode, while the present invention is not limited to this mode and the cavity resonator may be any form of circular, square and concentric and any mode of TM, TE and TEM. Further, the yoke is not a requisite constituent element of the present invention and the same effects as those of the first embodiment can be obtained even if there is no yoke. The permanent magnets are not limited to be disposed on the side of the processing chamber 6 at the atmospheric side thereof and may be disposed on the side of the processing chamber 6 at the vacuum side thereof.

Figure 9:
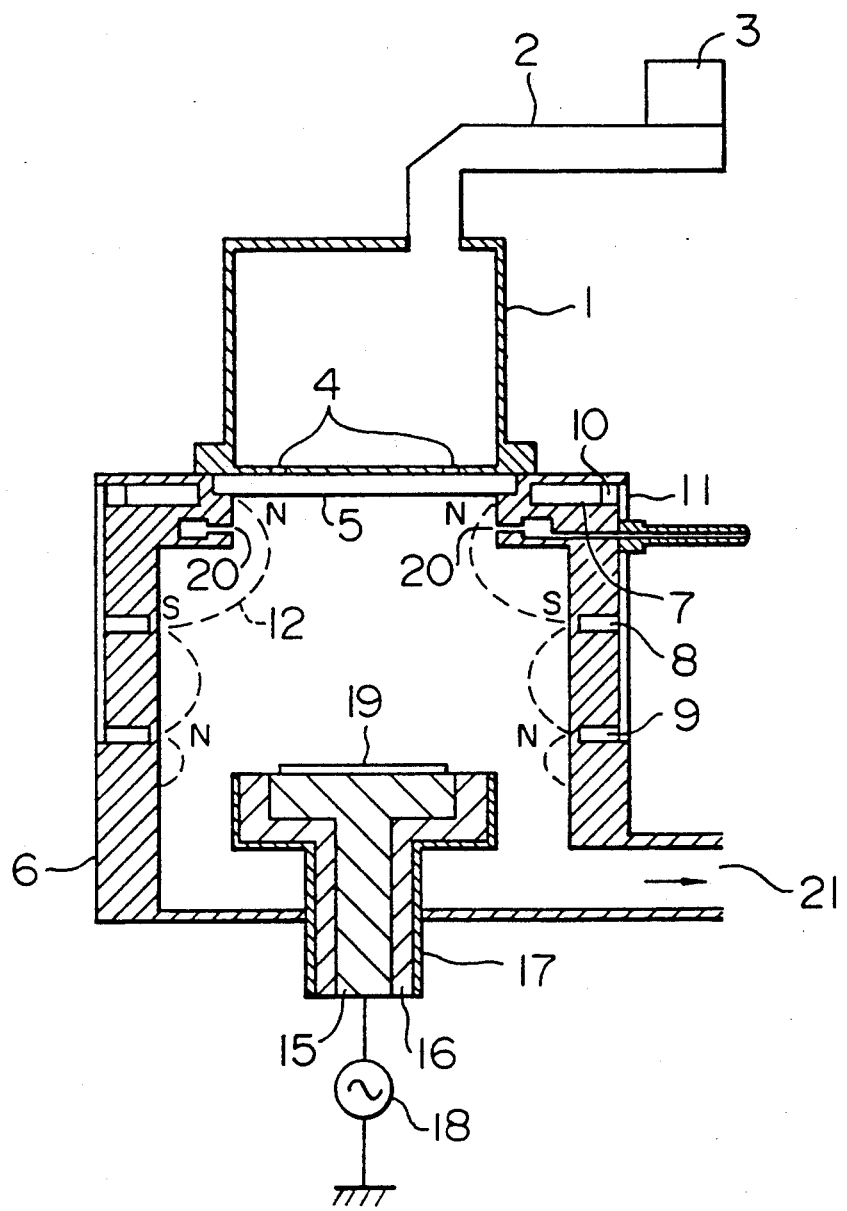
FIG. 9 is a longitudinal sectional view showing a second embodiment of a microwave plasma processing apparatus according to the present invention.
Figure 10:
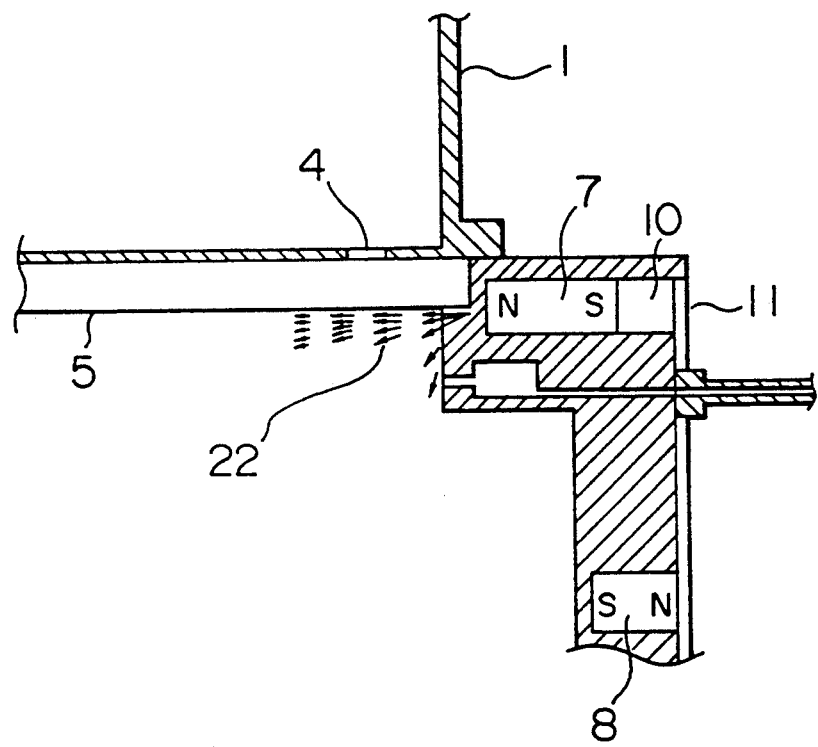
FIG. 10 is a partial sectional view showing a positional relation of magnets for realizing the second embodiment.

FIG. 9 is a longitudinal sectional view showing a second embodiment of a microwave plasma processing chamber according to the present invention. FIG. 10 is a partial longitudinal sectional view showing a positional relation of the microwave introducing window 5 and the permanent magnets 7 in FIG. 9. In this embodiment, a parallel magnetic field is also formed in the vicinity of the inner surface of the microwave introducing window 5, so that loss of plasma to the microwave introducing window 5 is suppressed. The parallel magnetic field can be formed by setting a lower surface of the microwave introducing window 5 and the center of the permanent magnet 7 in the height direction to substantially the same position. With the structure of FIG. 10, a calculation value of the magnetic flux density formed in the vicinity of the lower surface of the microwave introducing window 5 is represented by vector representation 22.

According to the embodiment, not only the same effects can be obtained by the same operation as in the first embodiment but also the following effects can be obtained. Since an electronic life of the plasma production area under the slots 4 radiating the microwaves can be extended, plasma can be produced stably by a low electric power. Further, since sputtering by plasma of the microwave introducing window 5 is reduced, exhaustion of the microwave introducing window 5 can be reduced. Accordingly, variation of radiation of the microwaves due to aging is small and plasma can be produced stably over a long time.

In the embodiment of FIG. 9, three groups of permanent magnets are disposed in the axial direction of the processing chamber 6, while four groups of permanent magnets may be disposed at equal intervals between the microwave introducing window and the upper surface of the stage 15.

Figure 11:
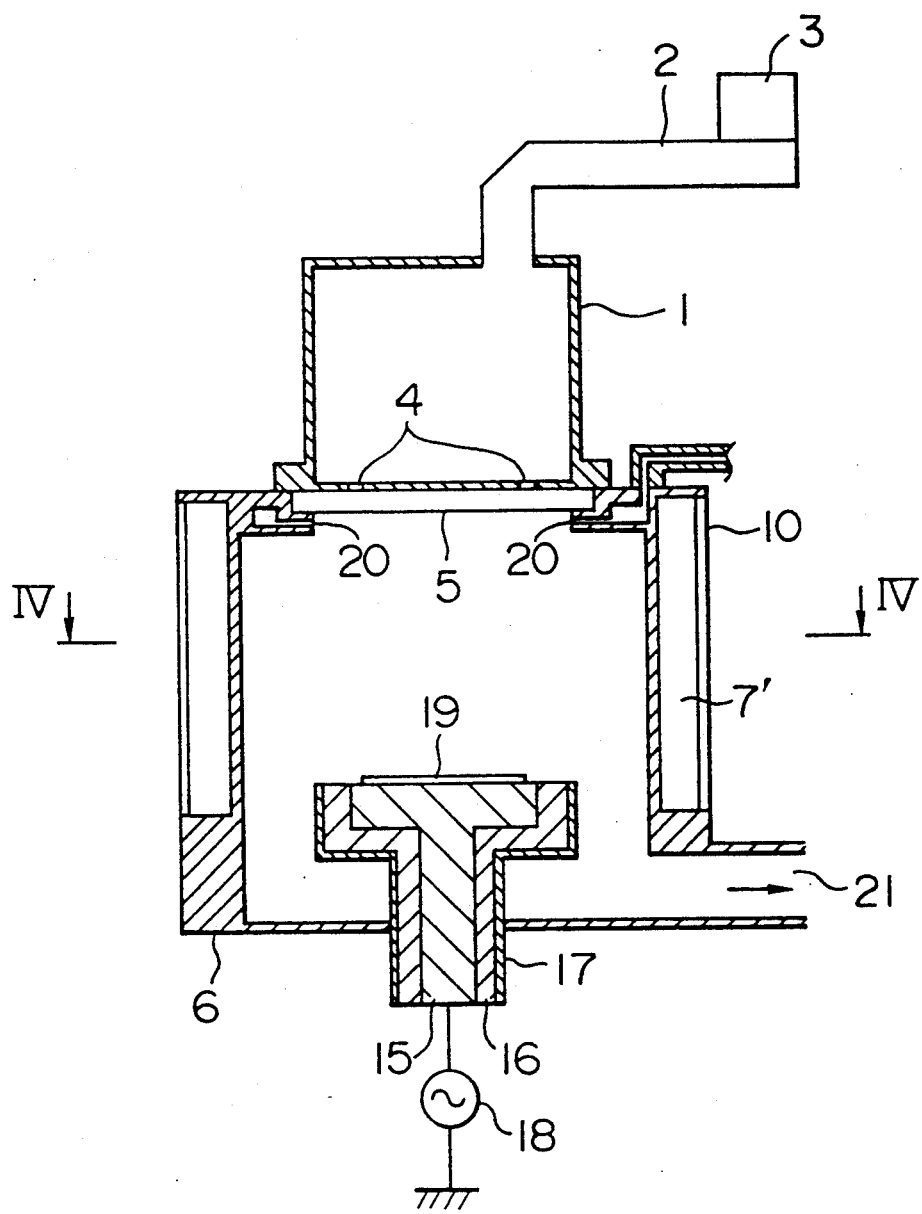
FIG. 11 is a longitudinal sectional view showing a third embodiment of a microwave plasma processing apparatus according to the present invention.

FIG. 11 is a longitudinal sectional view showing a third embodiment of the microwave plasma processing apparatus according to the present invention.

A sectional view of the processing chamber 6 taken along line IV—IV of FIG. 11 is the same as FIG. 4 showing the section taken along line IV—IV of FIG. 1 in the embodiment of FIG. 1 and it is accordingly omitted. In the embodiment, the multi-pole cusp magnetic field is formed by an even number of vertically long permanent magnets 7' disposed at an outer periphery of the processing chamber 6 and the permanent magnets 7' are arranged so that the upper end thereof is positioned on the side of the cavity resonator 1 with respect to the lower surface of the microwave radiation window 5.

According to the embodiment, since the magnetic field can be formed even in the vicinity of the microwave introducing window 5 in parallel thereto in the same manner as the second embodiment, not only the same effects as in the first embodiment can be obtained by the same operation as in the first embodiment but also the same effects as in the second embodiment can be also obtained.

Figure 12:
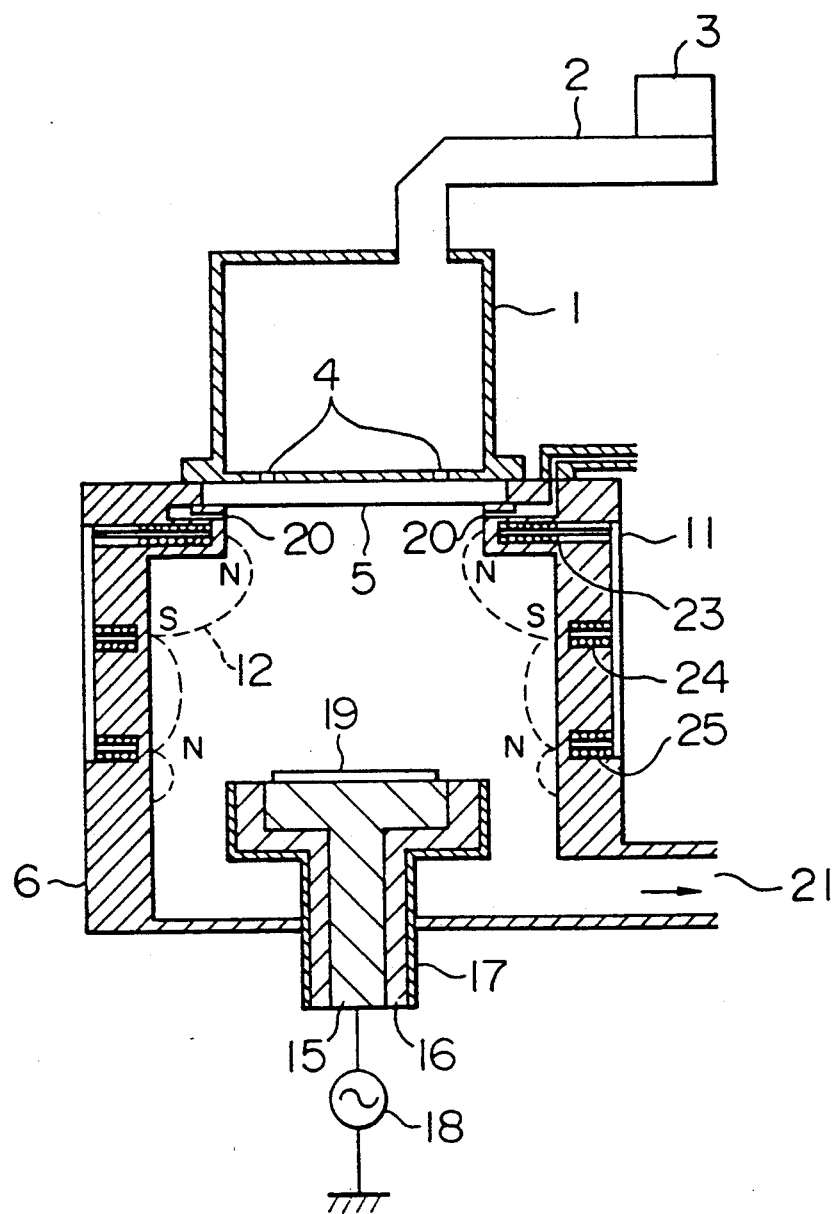
FIG. 12 is a longitudinal sectional view showing a fourth embodiment of a microwave plasma processing apparatus according to the present invention.

FIG. 12 is a longitudinal sectional view showing a fourth embodiment of the microwave plasma processing apparatus according to the present invention. In the embodiment, coil magnets 23, 24 and 25 are employed instead of the permanent magnets 7, 8 and 9 in the first embodiment to form the loss suppression area of plasma only in the vicinity of the inner wall of the processing chamber. Arrangement of the coil magnets 23, 24 and 25 in the transverse cross-section of the processing chamber is made similarly to FIGS. 3 and 4 of the first embodiment so that adjacent polarities of the coil magnets are opposite to each other.

In the embodiment, the same effects can be obtained by the same operation as in the first embodiment. Further, in the embodiment, since a value of current flowing through the coil magnets can be varied to control the intensity and the shape of the magnetic field, an optimal magnetic field can be formed in accordance with material of an object to be processed and a height of the processing chamber to thereby process the substrate having a large diameter uniformly.

Figure 14:
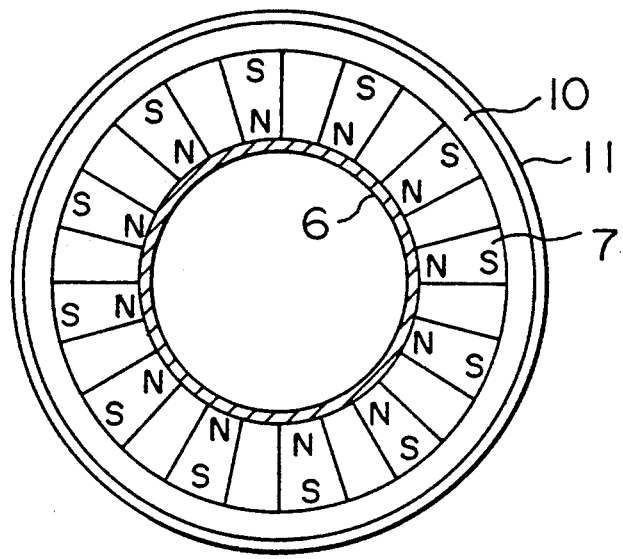
FIG. 14 is a cross-sectional view taken along line XIV—XIV of FIG. 13.
Figure 15:
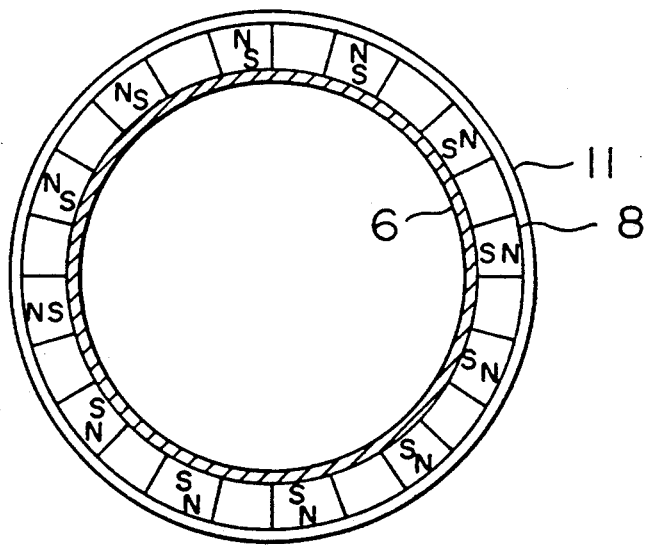
FIG. 15 is a cross-sectional view taken along line XV—XV of FIG. 13.

FIG. 13 is a longitudinal sectional view showing a fifth embodiment of the microwave plasma processing apparatus according to the present invention. FIGS. 14 and 15 are cross-sectional views of the processing chamber 6 of FIG. 13 taken along lines XIV—XIV and XV—XV of FIG. 13. In the embodiment, the polarities of the permanent magnets 7 and 8 on the side of the inner side of the processing chamber shown in FIG. 13 are opposite to each other, while the polarities of the permanent magnets 7 and 8 as viewed in the transverse cross-sectional view shown in FIGS. 14 and 15 are arranged so that the poles of the same polarities are adjacent to each other on the side of the inner wall of the processing chamber.

In the embodiment, the magnetic lines of force 12' are formed as shown in FIG. 13. Even in the fifth embodiment with such a structure, the same effects can be obtained in the same operation as in the fifth embodiment.

In the embodiment, description has been made to the dry etching by way of example, while the present invention can be applied to the processing apparatus of a plasma CVD apparatus and an ashing apparatus utilizing plasma and the substrate having a large diameter can be processed uniformly.

According to the present invention, since the magnetic field in which the magnetic lines of force are parallel to the inner wall of the processing chamber only in the vicinity of the inner wall of the processing chamber is employed to form the loss suppression area of plasma, the plasma is make uniform by the isotropic diffusion in the center area of the processing chamber and loss of plasma is suppressed so as to be small in the vicinity of the inner wall of the processing chamber. Accordingly, plasma in the vicinity of the semiconductor substrate having a large diameter can be maintained uniformly with high density. Further, since energy in the microwaves is effectively absorbed to electrons in plasma when the magnetic field for the electron cyclotron resonance condition is formed in the positions of the poles of the magnets in the vicinity of the inner wall of the processing chamber, the plasma having a large diameter can be maintained stably.

In addition, since sputtering damage of material of the inner wall due to plasma is reduced by forming the loss suppression area of plasma in the vicinity of the inner wall of the processing chamber, contamination of heavy metal from the inner wall of the processing chamber of the semiconductor substrate can be reduced and processing is made with low damage. Further, since effects of the high frequency bias is obtained uniformly over the whole surface of the semiconductor substrate, ion energy can be controlled uniformly over the whole surface of the substrate.

Accordingly, according to the present invention, the semiconductor substrate having a large diameter can be plasma processed uniformly at high speed with low damage and accordingly the productivity and yield in manufacturing of semiconductor devices can be improved.

We claim:

1. A microwave plasma processing apparatus comprising:
   a microwave generation source;
   a waveguide for supplying the microwave from the microwave generation source;
   a cavity resonator coupled to said waveguide for resonating the microwave supplied from the waveguide so as to increase the amplitude thereof, said cavity resonator including slits provided in a wall thereof;
   a plasma processing chamber coupled with said cavity resonator through a microwave introducing window and for producing plasma by the microwave supplied from said slits of said cavity resonator through said window and by internally introduced processing gas so as to enable processing of a specimen by the plasma in said plasma processing chamber; and
   a plurality of magnets provided at a periphery of said plasma processing chamber for forming a multi-pole cusp magnetic field in the vicinity of an interior of a wall portion of said plasma processing chamber at least proximate to said microwave introducing window where plasma is provided and along the interior of said wall portion of said plasma processing chamber to reduce diffusion of the plasma to said wall portion of said plasma processing chamber and providing an amplitude of the magnetic field in the vicinity of said specimen which does not influence the diffusion of said plasma in the vicinity of said specimen.

2. A microwave plasma processing apparatus according to claim 1, wherein each of said plurality of magnets has sufficiently high residual magnetic flux densities so that the magnetic flux density in positions of the magnetic poles in said processing chamber are 0/0875 T.

3. A microwave plasma processing apparatus according to claim 1, further comprising a stage disposed in said plasma processing chamber for placing said specimen thereon.

4. A microwave plasma processing apparatus according to claim 1, wherein said magnets include permanent magnets.

5. A microwave plasma processing apparatus according to claim 1, wherein said magnets include coil magnets.

6. A microwave plasma processing apparatus according to claim 1, wherein the magnetic flux density in positions of magnetic poles of said multi-pole cusp magnetic field is set to be an electron cyclotron resonance.

7. A microwave plasma processing apparatus according to claim 1, wherein said plurality of magnets are provided on the periphery of said plasma processing chamber so as to form the multi-pole cusp magnetic field extending in a longitudinal direction of the wall portion of said plasma processing chamber.

8. A microwave plasma processing apparatus according to claim 1, further comprising a magnetic field formed in parallel to a surface of said microwave introducing window being in contact with said plasma processing chamber to suppress loss of plasma in said microwave introducing window.

9. A microwave plasma processing apparatus according to claim 7, wherein said plurality of magnets are provided on the periphery of said plasma processing chamber so that adjacent poles in a circumferential direction of said plasma processing chamber and the longitudinal direction of said plasma processing chamber have opposite polarities.

* * * * *